United States Patent
Heck et al.

(10) Patent No.: US 11,222,987 B2
(45) Date of Patent: Jan. 11, 2022

(54) OPTICAL RECEIVER EMPLOYING A METASURFACE COLLECTION LENS HAVING CONCENTRIC BELTS OR RINGS

(71) Applicant: Intel Corporation, Santa Clara, CA (US)

(72) Inventors: John Heck, Berkeley, CA (US); Harel Frish, Qiryat Gat (IL); Paul R. West, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 767 days.

(21) Appl. No.: 15/927,391

(22) Filed: Mar. 21, 2018

(65) Prior Publication Data

US 2019/0044003 A1 Feb. 7, 2019

(51) Int. Cl.
| | |
|---|---|
| *H01L 31/0232* | (2014.01) |
| *G02B 6/42* | (2006.01) |
| *H01L 31/18* | (2006.01) |
| *G02B 1/00* | (2006.01) |

(52) U.S. Cl.
CPC ........ *H01L 31/02327* (2013.01); *G02B 1/002* (2013.01); *G02B 6/4206* (2013.01); *H01L 31/18* (2013.01)

(58) Field of Classification Search
CPC ... H01L 31/02327; H01L 31/18; G02B 1/002; G02B 6/4206; G02B 6/4204
See application file for complete search history.

(56) References Cited

U.S. PATENT DOCUMENTS

| | | | | |
|---|---|---|---|---|
| 6,493,475 | B1* | 12/2002 | Lin | ..................... G02B 6/4206 |
| | | | | 385/14 |
| 9,773,831 | B1* | 9/2017 | Yang | ................. H01L 27/14634 |
| 10,267,956 | B2* | 4/2019 | Arbabi | ................ G02B 5/0268 |
| 10,365,535 | B2* | 7/2019 | Ahmed | ............. C23C 16/45525 |
| 10,416,565 | B2* | 9/2019 | Ahmed | .................. G02B 1/002 |
| 10,527,851 | B2* | 1/2020 | Lin | ......................... G02B 5/30 |
| 10,720,993 | B2* | 7/2020 | Lezec | .................. H04B 10/071 |
| 10,795,168 | B2* | 10/2020 | Riley, Jr. | ........... H01L 27/14625 |
| 10,809,623 | B2* | 10/2020 | Ahmed | ..................... G03F 7/70 |
| 10,886,317 | B2* | 1/2021 | Akselrod | ................. G03H 1/00 |
| 2007/0040166 | A1* | 2/2007 | Kaluzhny | ......... H01L 27/14685 |
| | | | | 257/40 |

(Continued)

FOREIGN PATENT DOCUMENTS

CN 107317117 A * 11/2017

OTHER PUBLICATIONS

Reference number list for U.S. Pat. No. 6,493,475 of Lin (Lin) (Year: 2021).*

(Continued)

*Primary Examiner* — Andrew Jordan
(74) *Attorney, Agent, or Firm* — Schwabe, Williamson & Wyatt, P.C.

(57) ABSTRACT

In embodiments, an optoelectronic apparatus may include a substrate with a first side and a second side opposite the first side; a photodetector disposed on the first side of the substrate, the photodetector to convert a light signal into an electrical signal; and a dielectric metasurface lens etched into the second side of the substrate, the dielectric metasurface lens to collect incident light and focus it through the substrate onto the photodetector.

23 Claims, 11 Drawing Sheets

(56) References Cited

U.S. PATENT DOCUMENTS

| | | | | |
|---|---|---|---|---|
| 2017/0322418 | A1* | 11/2017 | Lin | G02B 27/0172 |
| 2018/0172988 | A1* | 6/2018 | Ahmed | H01L 33/58 |
| 2018/0335362 | A1* | 11/2018 | Yu | G01K 11/32 |
| 2019/0033683 | A1* | 1/2019 | Ahmed | B29C 65/1406 |
| 2019/0044003 | A1* | 2/2019 | Heck | G02B 6/4206 |
| 2019/0154877 | A1* | 5/2019 | Capasso | G02B 1/00 |
| 2019/0190236 | A1* | 6/2019 | Sundaram | H04B 10/803 |
| 2019/0243155 | A1* | 8/2019 | You | G02B 5/1876 |
| 2019/0383943 | A1* | 12/2019 | Dunn | G02B 3/0037 |
| 2019/0383969 | A1* | 12/2019 | Badano | G02B 27/005 |
| 2019/0384181 | A1* | 12/2019 | Ahmed | H01L 25/0753 |
| 2019/0386749 | A1* | 12/2019 | Lezec | G02B 1/002 |
| 2020/0072668 | A1* | 3/2020 | Han | G01J 3/027 |
| 2020/0096171 | A1* | 3/2020 | Han | H05B 47/105 |
| 2020/0098814 | A1* | 3/2020 | Yang | H01L 27/14645 |
| 2020/0150437 | A1* | 5/2020 | Lin | G02B 30/35 |
| 2020/0174163 | A1* | 6/2020 | Han | G02B 5/1876 |
| 2020/0271941 | A1* | 8/2020 | Riley, Jr. | G02B 27/0916 |
| 2020/0303443 | A1* | 9/2020 | Akselrod | B29D 11/00326 |
| 2021/0026248 | A1* | 1/2021 | Ahmed | H01L 25/0753 |
| 2021/0066893 | A1* | 3/2021 | Jang | H01S 5/1071 |
| 2021/0141146 | A1* | 5/2021 | Melli | G02B 27/017 |

OTHER PUBLICATIONS

Reference number list for U.S. Patent Application Publication No. 2019/0044003 of Heck et al. (Heck, the present application) (Year: 2021).*

Paul R. West et al., "All-dielectric subwavelength metasurface focusing lens," Optics Express, vol. 22, No. 21, Oct. 17, 2014, p. 26212-26221.

* cited by examiner

OPTICAL RECEIVER EMPLOYING A METASURFACE COLLECTION LENS HAVING CONCENTRIC BELTS OR RINGS

FIELD

The present invention relates to optoelectronics, and more particularly to optoelectronic devices including collection lenses and photodetectors.

BACKGROUND

Optical receivers for high-speed optical interconnect need to receive light from an optical fiber, focus it onto a photodetector (PD), and convert that high-speed optical signal into an electrical signal. To focus light onto a PD, a lens is used.

DETAILED DESCRIPTION

Figure 1:
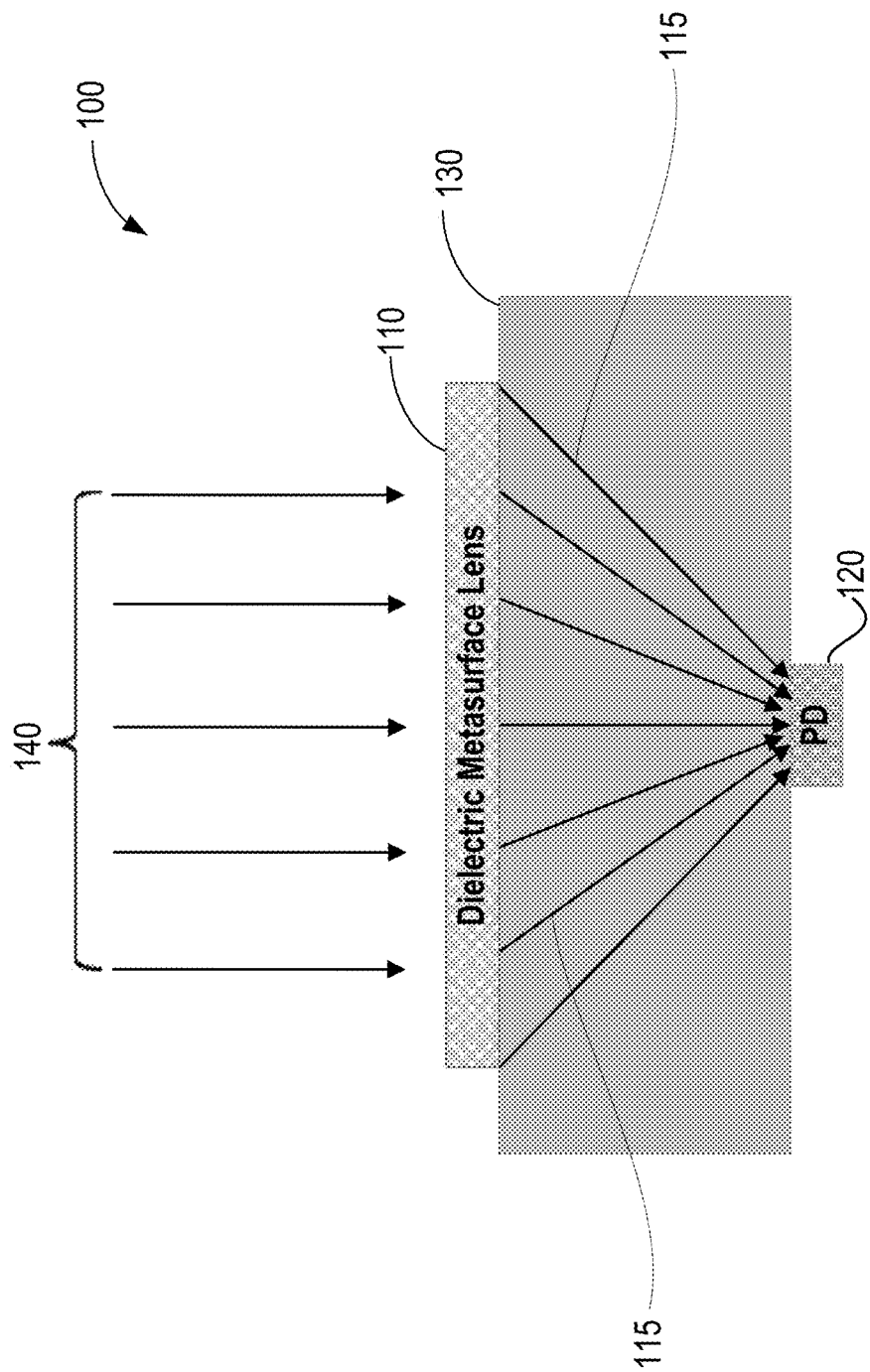
FIG. 1 illustrates an optical receiver with a metasurface lens, in accordance with various embodiments.

In embodiments, an optoelectronic apparatus may include a substrate with a first side and a second side opposite the first side, a photodetector disposed on the first side of the substrate, the photodetector to convert a light signal into an electrical signal, and a dielectric metasurface lens etched into the second side of the substrate, the dielectric metasurface lens to collect incident light and focus it through the substrate onto the photodetector.

In embodiments, the dielectric meta-surface lens may receive the incident light from an optical fiber. In embodiments, the incident light may include a high-speed optical signal. In embodiments, a spot size of the incident light may be larger than a diameter of the photodetector, and, in some embodiments, may be at least ten times as large as a diameter of the photodetector. In embodiments, for example, the spot size of the incident light may be from 100 to 1000 microns, and the diameter of the photodetector may be from 2 to 100 microns.

In embodiments, the diameter of the photodetector is chosen to reduce a capacitance of the photodetector.

In embodiments, the dielectric meta-surface lens may have a first side adjacent to the second side of the substrate, and a second side, opposite the first side, the second side having a planar surface.

In embodiments, the dielectric metasurface lens may comprise an array of subwavelength nanostructures to achieve a phase shift of the incident light of between 0 and $2\pi$. In embodiments, the substrate may comprise silicon, and the array of subwavelength nanostructures may comprise high refractive index silicon features surrounded by a low refractive index material. In embodiments, the low refractive index material may be one of $SiO_2$ or air, and the high refractive index silicon features may include at least one of pillars or holes.

In embodiments, the array of subwavelength nanostructures may include multiple concentric belts, each belt including pillars and/or holes of varying diameter within the belt, creating a phase distribution $\geq 2\pi$ within the belt.

In embodiments, the height of the subwavelength nanostructures may be determined by: Height$\geq \lambda_0/\Delta n$, where $\lambda_0$ is the incident light's wavelength in air, and $\Delta n$ is the difference in refractive index between the silicon structures and the low refractive index material. Similarly, in embodiments, the pitch of the subwavelength nanostructures may be determined by: Pitch$\leq \lambda_0/n_{high}$, where $\lambda_0$ is the incident light's wavelength in air, and $n_{high}$ is the refractive index of the high index material.

In embodiments, the dielectric metasurface lens may focus the incident light such that an amount of light towards a maximum is diffracted into the photodetector.

In embodiments, the substrate may have a high refractive index, and either low or no absorption of light at wavelengths of the incident light.

In embodiments, an optical communications system may include a light signal source to send a high speed optical signal, an optical fiber coupled to the light signal source, an optical coupler coupled to the optical fiber, to receive the high speed optical signal and couple it to an optoelectronic apparatus, and an optoelectronic apparatus, In embodiments, the optoelectronic apparatus may include a first side on which is provided an optoelectronic device, and a second side, opposite the first side, comprising a set of high refractive index nanostructures surrounded by a low refractive index material, the optoelectronic apparatus to receive the high speed optical signal and output an electronic signal.

In embodiments, the optical communications system may further include an electrical circuit, communicatively coupled to the optoelectronic apparatus, to receive the electrical signal. In embodiments, the high refractive index nanostructures may be made of silicon, and the surrounding low refractive index material may be one of air or silicon dioxide. In embodiments, the high refractive index nanostructures may comprise cylindrical mesas.

In embodiments, the optoelectronic device may be one of a light sensor or a camera.

In embodiments, a method of manufacturing a circuit package may include providing a layer having a top surface and a bottom surface, providing a light sensor on the top surface of the layer, and processing the bottom surface of the layer to focus incident light through the layer onto the light sensor. In embodiments, the processing may include etching the bottom surface of the layer to form an array of subwavelength nanofeatures, which may include at least two concentric rings, each ring comprising a plurality of high refractive index post or hole structures, the post or hole structures having varying dimensions within each ring.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Also, it is noted that embodiments may be described as a process depicted as a flowchart, a flow diagram, a dataflow diagram, a structure diagram, or a block diagram. Although a flowchart may describe the operations as a sequential process, many of the operations may be performed in parallel, concurrently, or simultaneously. In addition, the order of the operations may be re-arranged. A process may be terminated when its operations are completed, but may also have additional steps not included in the figure(s). A process may correspond to a method, a function, a procedure, a subroutine, a subprogram, and the like.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first layer formed, deposited, or otherwise disposed on a second layer" may mean that the first layer is formed, deposited, grown, bonded, or otherwise disposed over the second layer, and at least a part of the first layer may be in direct contact (e.g., direct physical and/or electrical contact) or indirect contact (e.g., having one or more other layers between the first layer and the second layer) with at least a part of the second layer.

As used hereinafter, including the claims, the term "circuitry" may refer to, be part of, or include an Application Specific Integrated Circuit (ASIC), an electronic circuit, an optoelectronic circuit, a communications system or device, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may implement, or functions associated with the circuitry may be implemented by, one or more software or firmware modules.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

It is noted that given the speed of modern data links, in an optical receiver, a small RC delay in the photodetector (PD) is required, thereby necessitating a small PD to minimize capacitance. In order to accomplish this, a high-quality lens accurately aligned to the PD may be provided. One approach may include use of a silicon infrared focusing lens. The lens may be a discrete component that is bonded or attached to the PD die, or an etched lens formed on the back side of the silicon wafer.

It is further noted, however, that discrete silicon lenses are provided by only a few suppliers globally, and tend to be expensive (for example, at least several U.S. dollars for a single die). The coupling loss depends, to a large extent, on the accuracy of alignment and die bonding, and, moreover, because a discrete lens is a separate component, at least two additional interfaces exist, adding losses and back-reflections.

On the other hand, an etched lens may create a ~50 um topography on a substrate backside, which may cause a wide variety of problems in wafer handling during fabrication, test, die preparation, and packaging. Not only must such a surface be treated very carefully, it is nearly impossible to repair any damage to it that may occur.

Thus, in embodiments, a dielectric metasurface may be integrated onto the backside of a receiver wafer in place of a standard convex lens. The dielectric metasurface may essentially use a subwavelength array of, for example, Si/SiO2 features with an effective refractive index creating a phase shift of $2\pi$. In embodiments, once a $2\pi$ phase shift is available, Fresnel zones may be designed to focus light from a large optical mode size onto a small photodetector on the front of the wafer. Unlike diffractive lenses, in embodiments, ideally no light will be diffracted away from the target photodetector. Thus, in embodiments, dielectric metasurface lens may focus the incident light such that an amount of light towards a maximum is diffracted into the photodetector.

It is noted that the use of Si/SiO2 features described herein is exemplary, and other high refractive index/low refractive index material combinations may also be used, such as, for example, Si/air, or Si/chalcogenide glass, for example.

In embodiments, whichever substrate is used should have: a large refractive index (as large as possible), low (ideally, no) absorption at the wavelength used, and be compatible with whatever other components are integrated with it, e.g., CMOS. Because silicon satisfies all three criteria, in many embodiments, it may be chosen for many embodiments. However, it is noted, in general a substrate may be chosen based on the application, as well as the wavelength of light desired. Thus, for applications in the mid-Infrared (IR), silicon may be a good choice. For optical applications (e.g., integrated camera and lens), an optically transparent material such as glass may be used.

In embodiments, a dielectric metasurface lens may be fabricated using existing fabrication tools and processes. In embodiments, the dielectric metasurface lens may have a fully planar backside surface, largely eliminating any backside handling issues. In embodiments, the planar lens itself may be embedded within oxide (e.g., $SiO_2$) and sealed beneath an antireflective coating, so that any cleaning (if required) may be straightforward.

Thus, in embodiments, a dielectric metasurface lens may be used in place of a conventional convex lens. The dielectric metasurface lens may further have a planar nanostructured surface to perform the focusing function, as next described in connection with FIG. 1.

FIG. 1 illustrates an example metasurface lens, according to various embodiments. Dielectric metasurface lens 110 may operate by modifying the refractive index of a thin layer using subwavelength nanostructures to achieve a phase shift that can be defined between 0 and $2\pi$. In embodiments, this may be achieved using an array of high-refractive-index silicon features surrounded by low-refractive-index material such as air or oxide, such as, for example, pillars or holes, or rectangular posts and tubes (rectangular cavities in the top of a substrate). Continuing with reference to FIG. 1, dielectric metasurface lens 110 may be provided on the backside of substrate 130. As noted, its upper surface may be planar. On the front or top side of substrate 130 photodetector 120 may be provided. As noted below, in embodiments, photodetector 120 may be smaller or significantly smaller than dielectric metasurface lens 110. Thus, lens 110 may be positioned so as to focus incident light 140 (illustrated schematically by several rays 140) onto photodetector 120. Light rays 140 are refracted through lens 110 so as to hit photodetector 120. This process is shown schematically in FIG. 1 by refracted rays 140.

Figure 2:
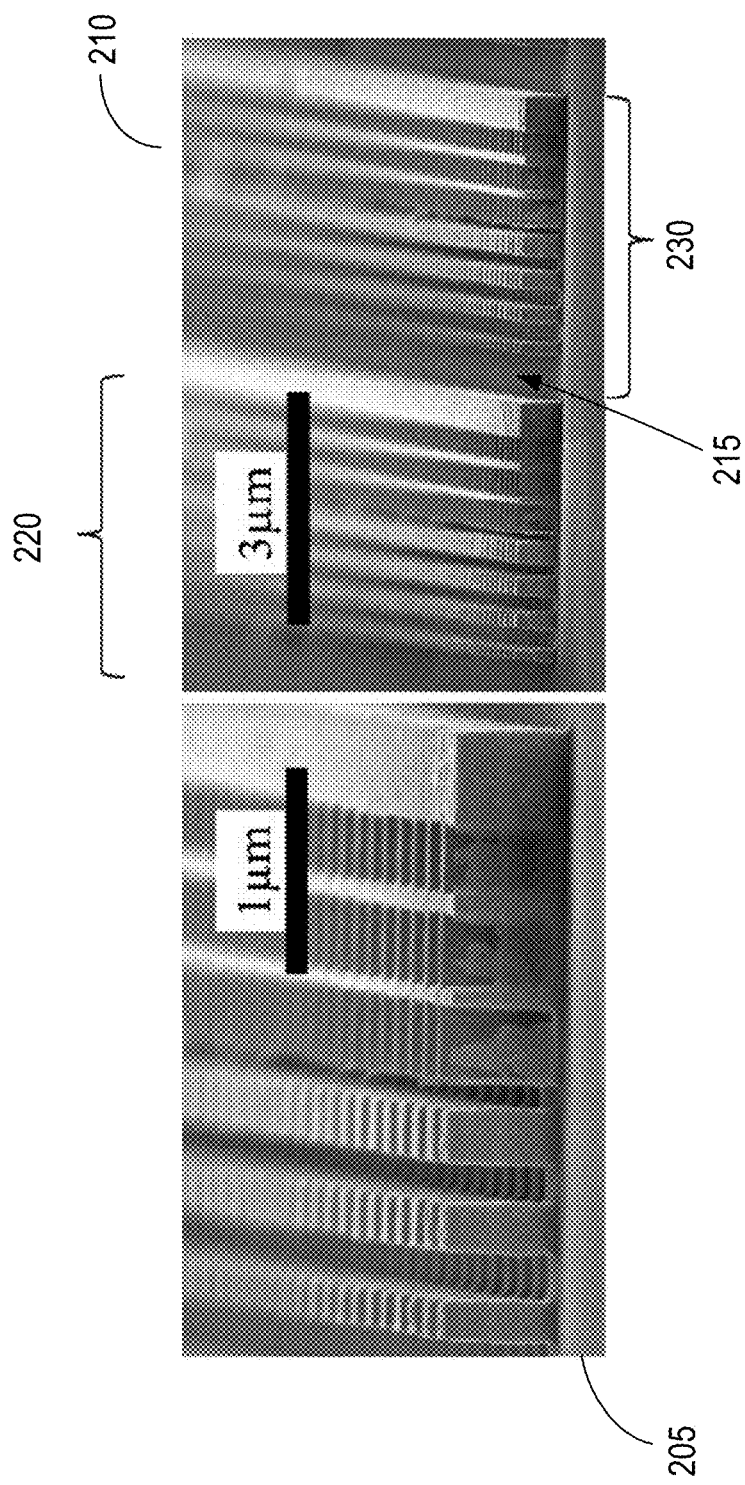
FIG. 2 illustrates example post structures that may be provided in a metasurface lens, in accordance with various embodiments.
Figure 4:
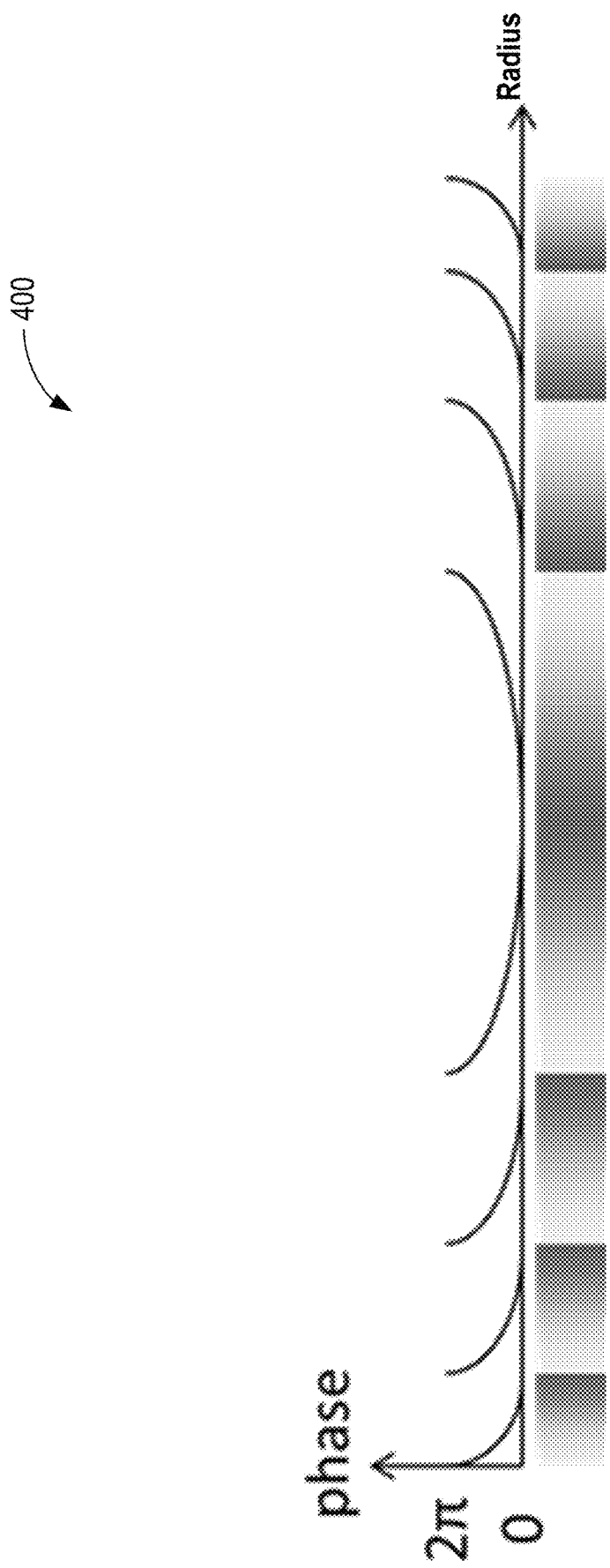
FIG. 4 depicts a schematic of an example metasurface lens using a graded index dielectric layer (grey=high index, white=low index), and a plot showing desired phase as a function of radius.

FIG. 2 illustrates an example silicon nanostructure array 205 that may be used to modulate the phase of incident light in a portion of a planar metasurface lens. The array may comprise several instances of posts and hole structures, as shown (and, for that reason may be referred to herein as a "nanopost array"). FIG. 2 depicts scanning electron microscope images 205 and 210 of a pattern of rows of example nanostructures, each row having a post or a hole of different dimension. As may be seen, the array is planar, as each structure has the same height. The example structures shown may be made of Silicon, for example. Where no protruding material is seen, the space between, or within, structures may be filled with, for example, air, or for example, another dielectric, such as $SiO_2$. It is here noted that in many cases light may be focused from a fiber or other optical component, for example a demultiplexer, with a large spot size (e.g., 100 s of microns) to a small photodetector, for example, having a diameter of a few microns to tens of microns. In this case, a Fresnel lens is useful for capturing and focusing the entire optical mode, as shown in FIG. 4, described below.

Image 210 shows a broader view of the silicon nanopost array shown in image 205, here showing two full cycles of the array structure. As shown, one full cycle is approximately 3 microns in length in this example. In image 210, an individual full cycle is shown at each of 220 and 230, and, as shown at 215, cycle 230 begins (going from left to right) with a flat row of no structures at all. This space may, as noted, be filed with a low refractive index dielectric, and in the examples of FIG. 2 that is air. This row of plain air is placed adjacent to the last row of cycle 220, which is the largest post dimension, and, as a result there is a discontinuity at the edge of any two cycles of the array structure. Thus, in each band, the first, or far left structure is pure air, and the last, or far right structure, of each "ring" or "band" is pure Silicon. The filling fraction of Silicon increases from left to right.

Thus, as described in detail below, a single lens, such as dielectric metasurface lens 110 of FIG. 1, may have several "bands", "belts" or "rings" in which a defined pattern of nanostructures is provided. The pattern may, in embodiments, repeat in each band, belt or ring of the lens, as shown in image 210 of FIG. 2. In embodiments, the width of each band, belt or ring, as noted below, may change with distance from the center of the lens, or along some other radial distance axis. As shown, the example posts and hole structures shown in FIG. 2 have different dimensions, and thus modulate incident light in different ways, based on a changing "filling fraction" of a high refractive index material, such as silicon, versus a low refractive index material, such as air. In embodiments, several types/dimensions of nanostructures may be used in a planar dielectric metasurface lens, so as to modify the phase of the incident light to a desired value as a function of radial distance along the lens, as described below.

As noted above, in embodiments, in order to achieve a $2\pi$ phase shift, the height of the subwavelength nanostructures may be determined by the following equation:

$$\text{Height} \geq \lambda_0 / \Delta n,$$

where $\lambda_0$ is the incident light's wavelength in air, and $\Delta n$ is the difference in refractive index between the silicon structures and the low refractive index material. For example, silicon pillars surrounded by air would have a $\Delta n$ equal to (nSilicon−nAir)=(3.5−1)=2.5.

Similarly, in embodiments, the pitch of the subwavelength nanostructures (i.e., the distance between their respective centers) may be determined by the following equation:

$$\text{Pitch} \leq \lambda_0 / n_{high},$$

where $\lambda_0$ is the incident light's wavelength in air, and $n_{high}$ is the refractive index of the high index material.

In embodiments, a metasurface lens such as that illustrated in FIG. 1, with nanostructures such as are shown in FIG. 2, may be fabricated, for example, using a standard toolset in a typical 300 mm semiconductor toolset. In embodiments, for light within the range of 1270-1410 nm, a pitch of the pillar features may be <362 nm, for example. In embodiments, the pitch (period) may be determined by the minimum value from the equation above (Pitch≤$\lambda 0/n_{high}$). In this case, the smallest wavelength to be used with the example lens is 1270 nm, so this value may be used in the equation (and the $n_{high}$ value that corresponds to this wavelength). It is noted that if one used the period corresponding to 1410 nm light, it may work fine for light at 1410 nm, but light of smaller wavelengths, for example, 1270 nm, would have strong scattering. In embodiments, for 1270 nm, the height may have a depth of about 720 nm to achieve the desired 2π phase shift.

Figure 3:
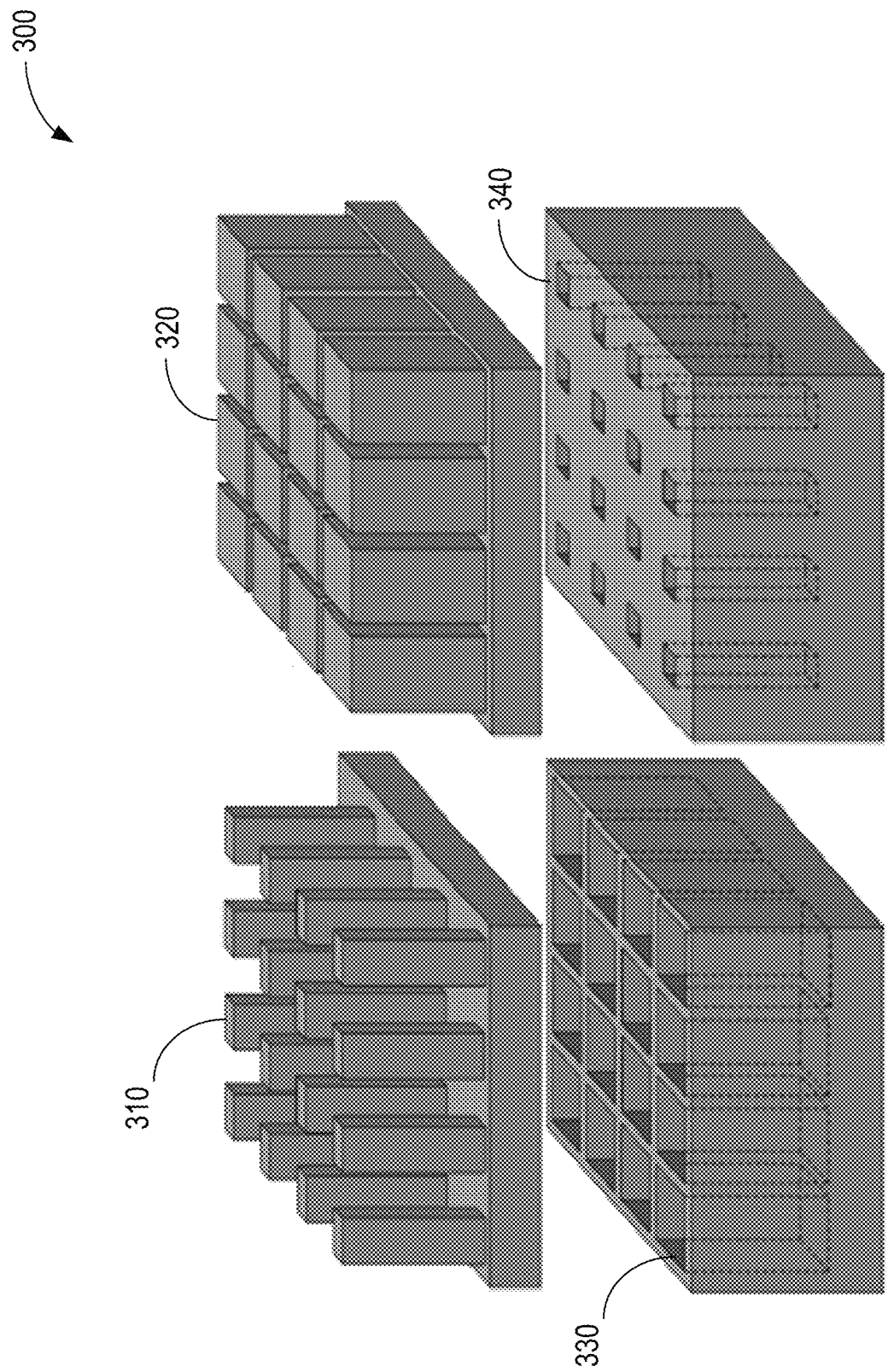
FIG. 3 illustrates schematics of example post and hole structures that may be provided in a metasurface lens, in accordance with various embodiments.

FIG. 3 illustrates an example sequence of four types of post/hole structures that may be used within a band in an example metasurface lens according to various embodiments. With reference thereto, beginning with 310, a set of small silicon posts surrounded by air, for example, is shown. Moving to 320, a set of very large posts surrounded by air is shown, and then moving to 330, a silicon block with several holes provided in it is seen. Finally, at 340 is seen a nearly all silicon block, with smaller holes provided within it. Thus, as one moves from 310 to 340 the filling fraction of silicon increases.

It is here noted that the calculation for diameter or dimension (or filling fraction) for a nanostructure is independent of pitch (period). Calculating the structure and shape and size must be done using simulations. It can be roughly approximated by filling fraction, e.g., 50% Si, 50% SiO2 would have a refractive index halfway between that of Si and SiO2, but this is a very rough estimate, and it is noted that the actual values are not linear, depend on shape and other factors.

Thus, in embodiments, one may use a Finite Element Model to accurately model the shape and size of a post/hole. Filling fraction, shown in FIG. 3 and described below with reference to FIG. 5B, may be a rather rough approximation, and not very accurate. It will also depend on the shape of the actual nanostructure; for example, a 50% Si, 50% SiO2 structure may have different size depending on if the structure is square or circular shaped, as in cylindrical pillars instead of posts, as in the examples shown in FIGS. 2 and 3. In embodiments, square or rectangular posts (as shown in FIGS. 2 and 3) are an obvious choice, as they tessellate well to make a high filling fraction. It is here noted that it is essentially impossible to use cylindrical structures to obtain a 99% filling fraction, but quite easy for squares/rectangles.

Figure 3A:
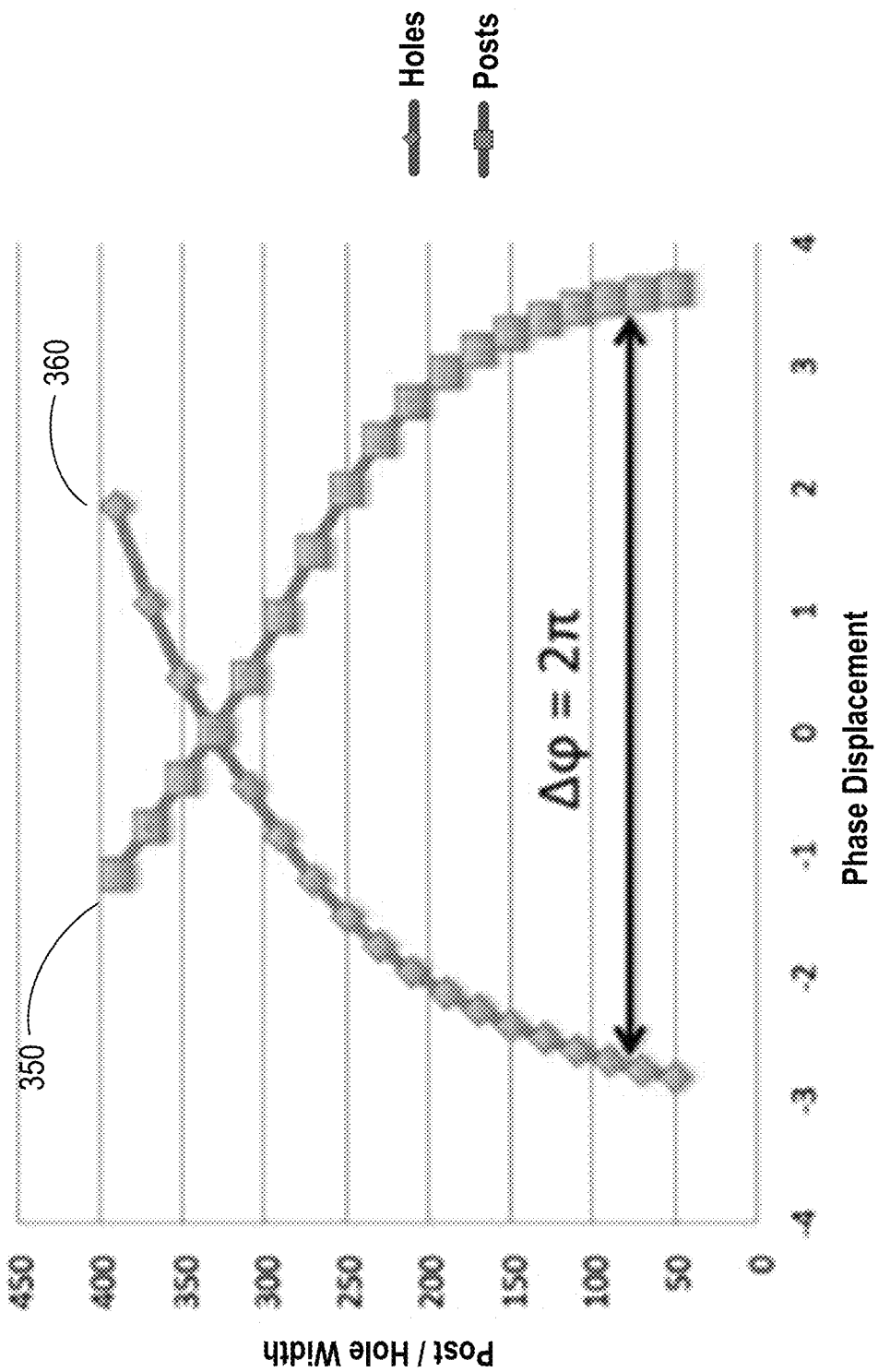
FIG. 3A depicts a plot of phase displacement as a function of post or hole width, in accordance with various embodiments.

FIG. 3A, a plot of a simulation of phase displacement versus post/hole width, illustrates how the phase changes as the width of the posts/holes changes. The structures represented in FIG. 3A were Silicon/Air metasurface structures. With reference to FIG. 3A, the phase displacement is non-linear as the post/hole size changes.

As noted above, to illustrate the desired phase shifts, FIG. 4 depicts a schematic of an example metasurface lens using a graded index dielectric layer (dark grey=high index, light grey/white=low index), and a plot showing desired phase as a function of radius (from the edge of the lens, the center of the lens thus being in the middle of the plot, where the phase is 0 at the bottom of the center curve).

Figure 5A:
FIG. 5A depicts a design of an example metasurface lens, where phase of incident light is modulated in each of several concentric rings, in accordance with various embodiments.
Figure 5B:
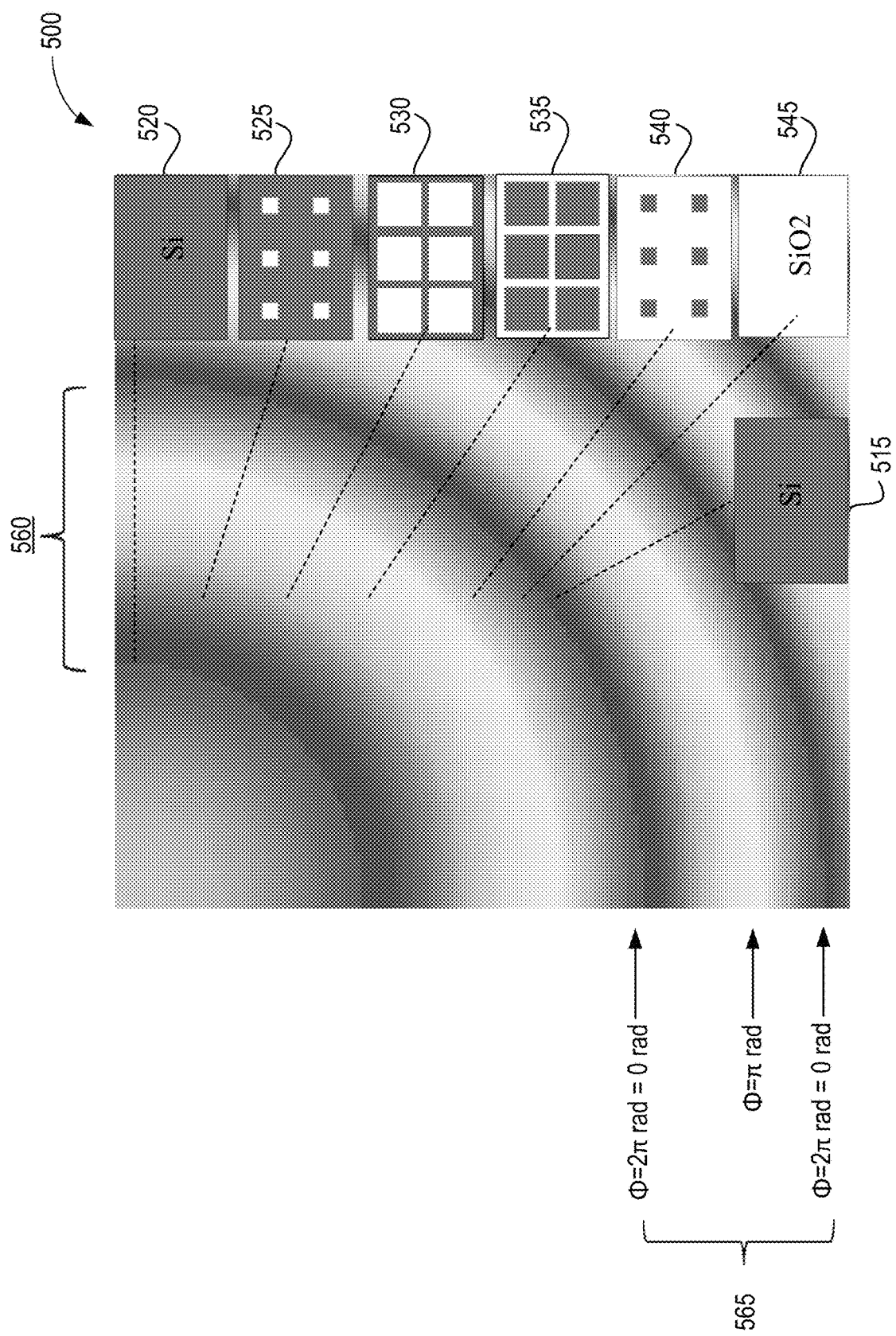
FIG. 5B depicts a magnified view of the bottom right quarter of the example lens of FIG. 5A, to illustrate various structures used in each ring to modulate phase.

FIGS. 5A and 5B illustrate an example lens with a circular design, in accordance with various embodiments. FIG. 5A shows the example lens with a repeated ring structure, illustrating the change in phase at different radial distances along the lens in each of several concentric rings. The closest ring to the center is shown at 510, and each band of different greyscale intensity represents a different phase shift to be applied to incident light, such as, for example, incident light 140 in FIG. 1.

In greater detail, FIG. 5B shows a top-down image of the posts/hole structures. In this example, this high-index material is Si, the low-index material is SiO2. Whereas FIG. 5A shows the full example circular lens, FIG. 5B depicts a zoomed in quarter of the lens to show the structures used to modulate phase. As seen in FIG. 5B, three full ring structures are shown, the first of which, starting near the center of the lens, is ring 560, and the second ring, surrounding ring 560, is ring 565.

As noted above, in embodiments, the rings, or "concentric belts" may include varying structures, where each structure has a phase shift between 0 and 2π. Each concentric belt will consist of structures that provide the same 0 to 2π phase shift, but will have varying belt widths to provide the required phase profile. The required phase shift at each location on the lens is:

$$2\pi*((d*n_{high})\text{MOD }\lambda_0),$$

where d is the distance between the structure and the center of the photodetector, $n_{high}$ is the index of the substrate, and MOD $\lambda_0$ is the remainder after dividing by the wavelength. It is here noted that the distance d is the 3D distance through the substrate. The phase shift equation determines the focal point, and thus, in embodiments, should be calculated taking into account the wafer or substrate thickness. In embodiments, the shape of the lens (i.e., size of rings or belts) may generally be different depending on wafer thickness, just as one would use a lens with a different focal length, depending on distance between the lens and a photodetector.

In embodiments, the width of each belt may be determined by the equation above (a function of substrate thickness, refractive index, etc.), and may start and end with each 0 to 2π phase discontinuity. In embodiments, the belt width will decrease with each concentric ring (as seen in FIGS. 5A and 5B, and as also seen in FIG. 4, where the rings closer to the center have a wider ring size. In embodiments, the actual number of belts will be determined by the incoming spot size, which may have a minimum of 1 (in radial direction), and no maximum value.

Continuing with reference to the example of FIG. 5B, there are shown six different structures, including the 100% Si 520, and the 100% SiO2 545. In between them are structures that have fractions of both Si and SiO2, in varying ratios, where Si is represented in dark grey, and SiO2 in white, as shown for structures 525 (mostly Si with six rectangular "holes" cut into the Si), 530 (mostly SiO2 rectangular "holes" cut into the Si framework), 535 (inverse of 530, mostly Si), and 540 (inverse of 525, mostly SiO2 with six small rectangular posts of Si). Thus, the six structures actually comprise three pairs of nested inverse pairs, where 520 is all Si and its partner 545 is all SiO2, and then the next inner pair 525 and 540 each have six small posts of one medium surrounded by the other, and the next inner pair 3535 and 530 each have six large posts of one medium, surrounded by the other. Thus, rather than thinking of these as 4 or 6 discrete structures, they can be conceptualized as a continuum of Si/SiO2 filling fractions from 100% Si (top image) to 100% SiO2 (bottom image). In other examples, there may be smaller holes between the top two structures 520 and 525, or smaller posts between the bottom two structures 540 and 545, etc. Thus, in embodiments, the overall "pattern" of Si-to-SiO2 transition may repeat within each belt, though the exact dimensions of the posts/holes will likely be different.

It is noted that in FIG. 5B, the darker color on the center side of each belt represents the high Si (low SiO2) filling fraction structures, as shown by the dotted line running from structure 520, and the lighter grey at the outside of each belt, such as shown by the dotted line running from structure 545, represents the high SiO2 (low Si) filling fraction structures. Thus, at the edge of each ring there is a sharp discontinuity between an all Si structure and an all SiO2 structure. The structures in the center are no different than the other belts (transitioning from more Si to more SiO2), it is noted. It is further noted that the exact structure (whether more Si or SiO2) used in the center of the lens is not that relevant, it being the transition from structure to structure that is important.

Figure 6:
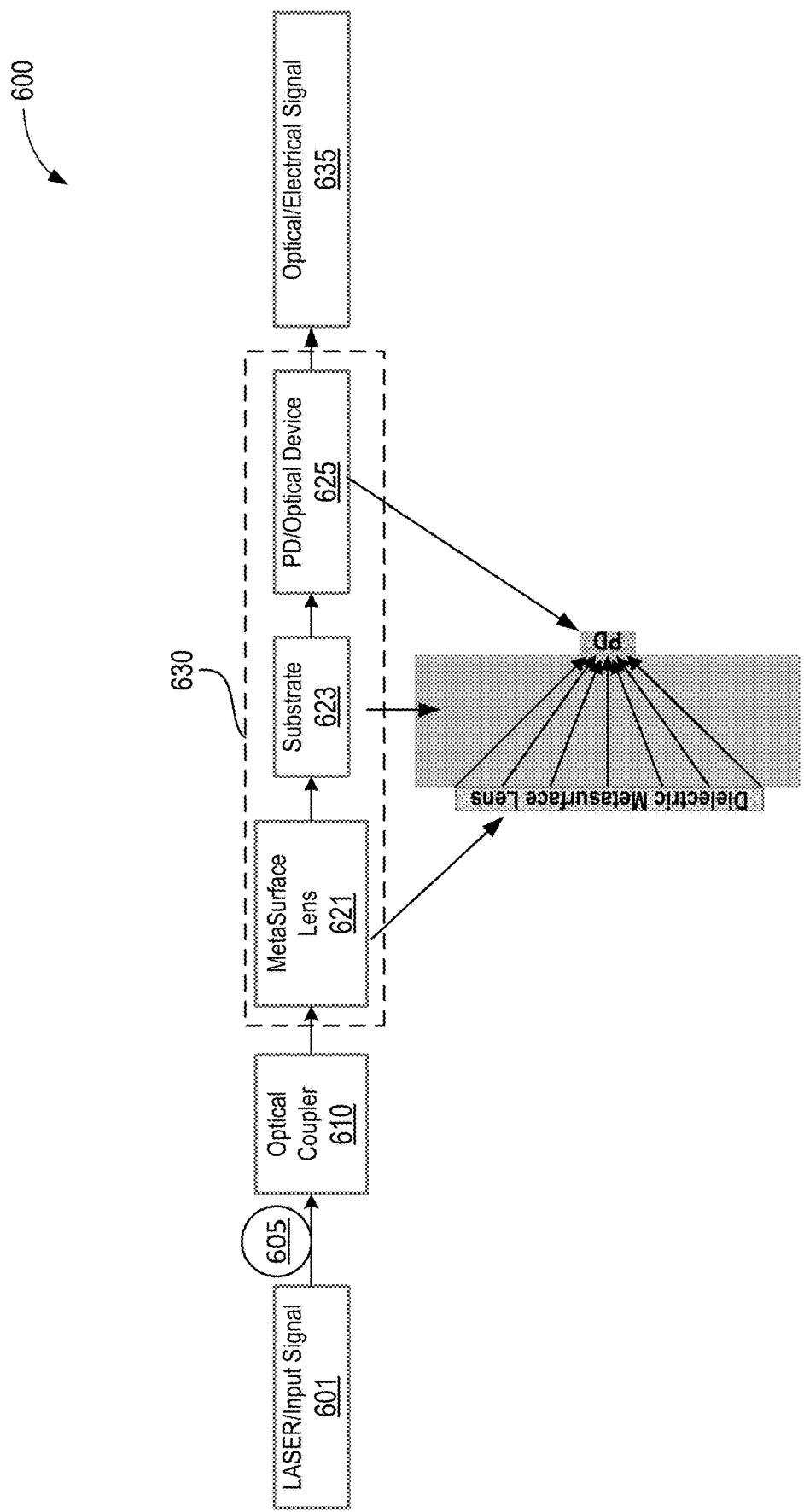
FIG. 6 depicts an example communications system, in accordance with various embodiments.

With reference to FIG. 6, an example optoelectronic communications system 600, in accordance with various embodiments, is presented. As shown in FIG. 6, an optical signal 601 may be generated, and sent through a fiber or air pathway 605, to an optical coupler 610. Optical coupler 610 may couple the signal into a metasurface lens 621 of an optical receiver 630, which may focus the light signal through substrate 623, and onto a PD or other optical device 625, as described above. PD or optical device (e.g., a camera) 625 may then convert the optical signal to an electrical signal 635, and output the electrical signal 635 to another electrical device (not shown). It is noted that the three elements 621, 623 and 625, collectively 630, together comprise an example optical receiver according to various embodiments, as is shown in FIG. 6 by mapping these three elements to those of the diagram of FIG. 1, as shown.

Figure 7A:
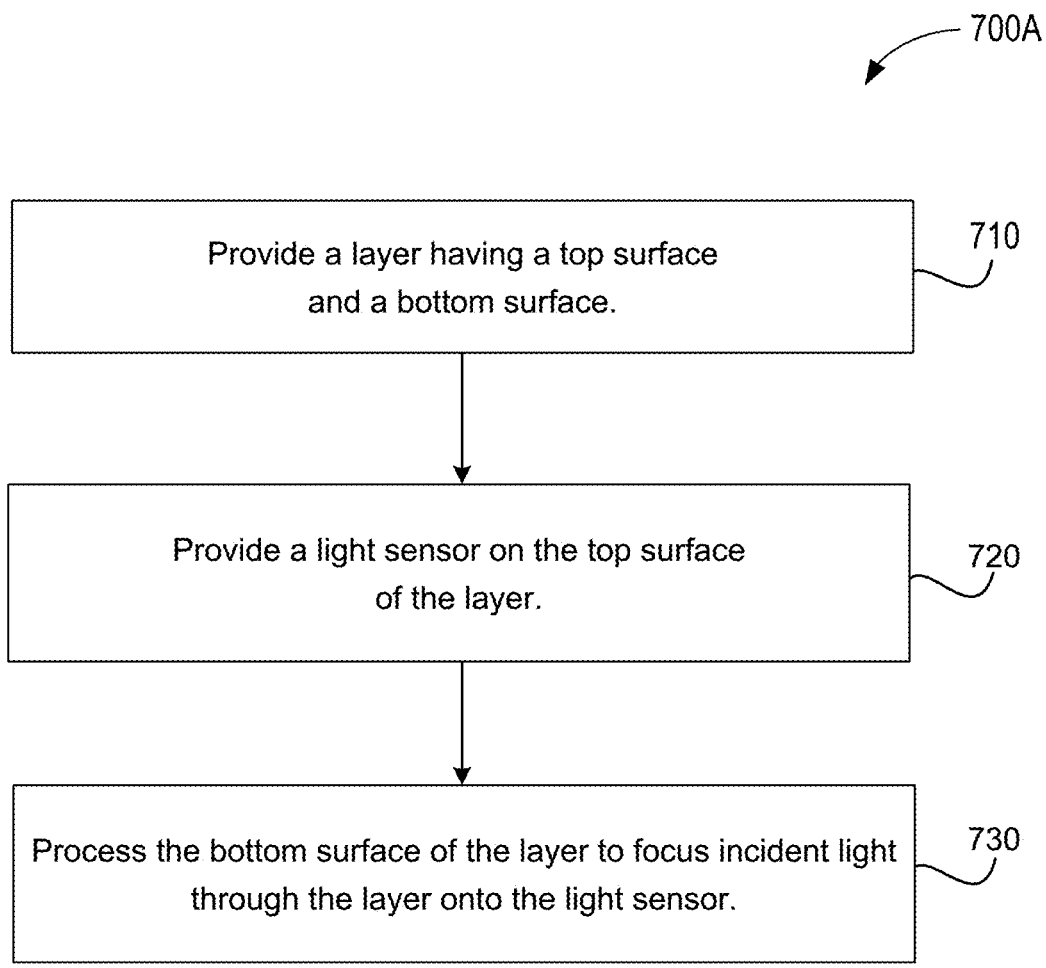
FIG. 7A illustrates an overview of the operational flow of a process for providing an optoelectronic receiver, in accordance with various embodiments.
Figure 7B:
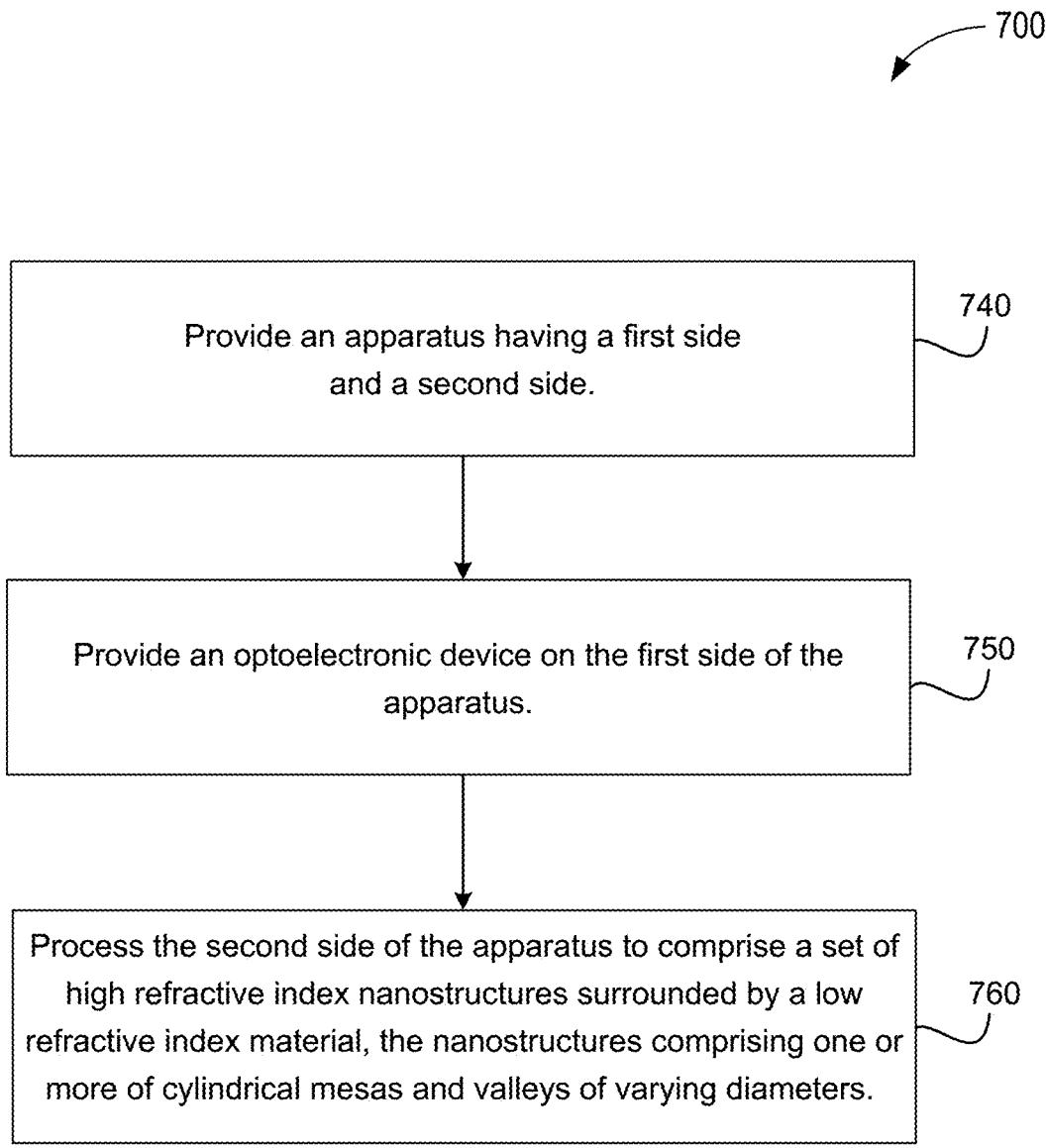
FIG. 7B illustrates an overview of the operational flow of an alternate process for providing an optoelectronic receiver, in accordance with various embodiments.

FIGS. 7A and 7B, next described, illustrate example processes for manufacturing or fabricating an optical receiver in accordance with various embodiments.

With reference to FIG. 7A, an overview of the operational flow of a process for manufacturing a circuit package, in accordance with various embodiments, is presented. Process 700A may be performed by various fabrication apparatus and methods, such as, for example, using a standard toolset in a typical 300 mm semiconductor toolset, as noted above. Process 700A may include blocks 710 through 730. In alternate embodiments, process 700A may have more or less operations, and some of the operations may be performed in different order.

Process 700A may begin at block 710, where a layer having a top surface and a bottom surface may be provided. From block 710 process 700A may proceed to block 720, where a light sensor may be provided on the top surface of the layer. The light sensor may be, for example, a photodetector, a portion or element of a larger optical device, or another optoelectronic apparatus, for example. From block 720 process 700A may proceed to block 730, where the bottom surface of the layer may be processed, for example, by etching, such that the bottom surface of the layer may focus incident light reaching the top of the light sensor through the layer onto the light sensor. At block 730, process 700A may terminate.

With reference to FIG. 7B, an overview of the operational flow of an alternate process 700B for manufacturing an optoelectronic apparatus, in accordance with various embodiments, is presented. As was the case for process 700A, process 700B may be performed by various fabrication apparatus and methods, such as, for example, using a standard toolset in a typical 300 mm semiconductor toolset. Process 700B may include blocks 740 through 760. In alternate embodiments, process 700B may have more or less operations, and some of the operations may be performed in different order.

Process 700B may begin at block 740, where an apparatus having a first side and a second side may be provided. From block 740 process 700B may proceed to block 750, where an optoelectronic device may be provided on the first side of the apparatus. The optoelectronic device may be, for example, a light sensor or a camera, for example. From block 750 process 700B may proceed to block 760, where the second side of the apparatus may be processed to comprise a set of high refractive index nanostructures surrounded by a low refractive index material, the nanostructures comprising one or more of cylindrical mesas and valleys of varying diameters. For example, the high refractive index nanostructures may be made of silicon, and the surrounding low refractive index material may be one of air or silicon dioxide. At block 760, process 700B may terminate.

Figure 8:
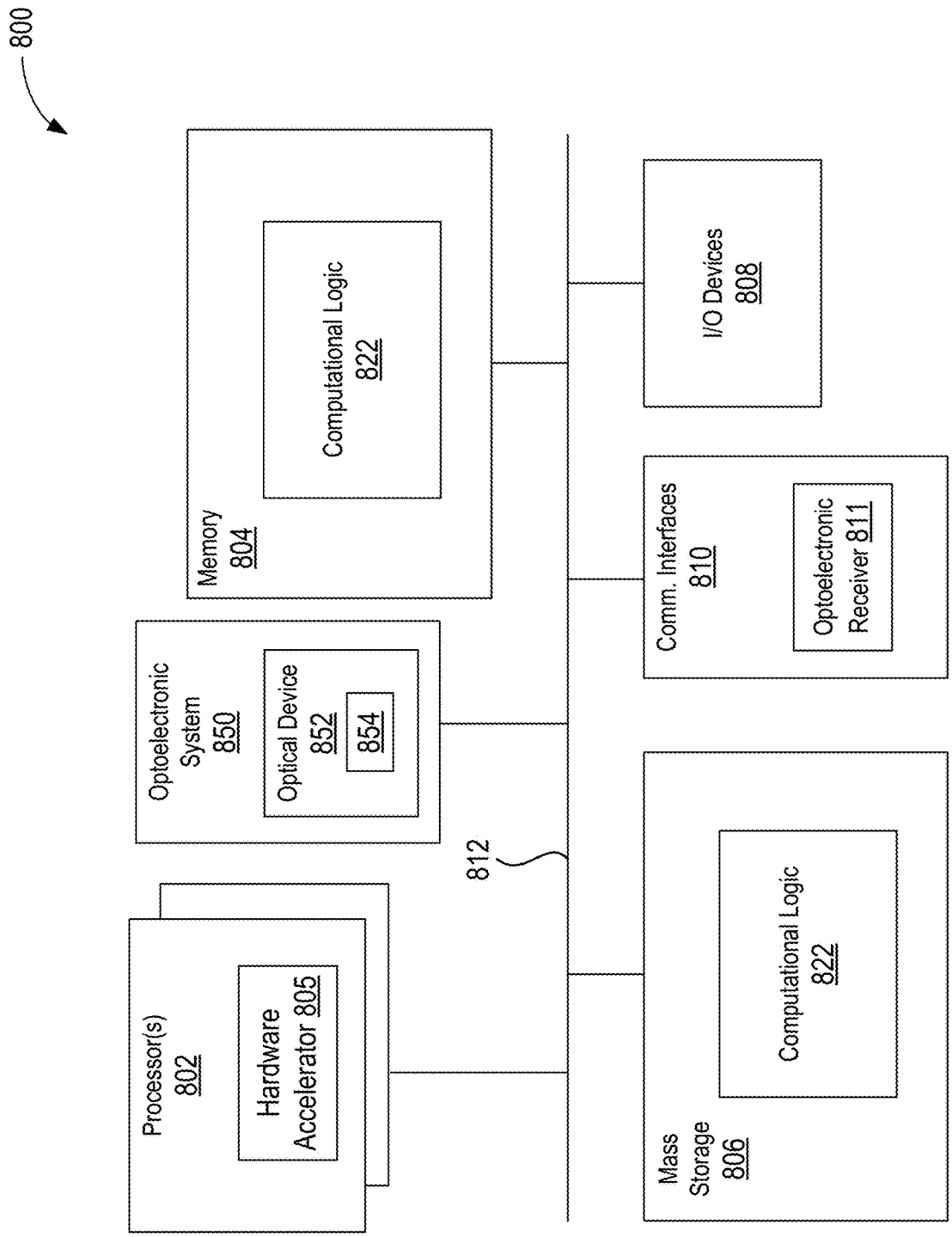
FIG. 8 depicts a block diagram of a computer device suitable for practicing the present disclosure, in accordance with various embodiments.

Referring now to FIG. 8 wherein a block diagram of a computer device suitable for practicing the present disclosure, in accordance with various embodiments, is illustrated. As shown, computer device 800 may include one or more processors 802, and system memory 804. Each processor 802 may include one or more processor cores, and hardware accelerator 805. An example of hardware accelerator 805 may include, but is not limited to, programmed field programmable gate arrays (FPGA). In embodiments, processor 802 may also include a memory controller (not shown). In embodiments, system memory 804 may include any known volatile or non-volatile memory.

Additionally, computer device 800 may include mass storage device(s) 806 (such as solid state drives), input/output device interface 808 (to interface with various input/output devices, such as, mouse, cursor control, display device (including touch sensitive screen), and so forth) and communication interfaces 810 (such as network interface cards, modems and so forth, including optoelectronic modules having optoelectronic receivers such as shown in FIG. 1). In embodiments, communication interfaces 810 may support wired or wireless communication, including near field communication. The elements may be coupled to each other via system bus 812, which may represent one or more buses. In the case of multiple buses, they may be bridged by one or more bus bridges (not shown).

Each of these elements may perform its conventional functions known in the art. In particular, system memory 804 and mass storage device(s) 806 may be employed to store a working copy and a permanent copy of the executable code of the programming instructions of an operating system, one or more applications, and/or various software implemented components, collectively referred to as computing logic 822. The programming instructions implementing computing logic 822 may comprise assembler instructions supported by processor(s) 802 or high-level languages, such as, for example, C, that can be compiled into such instructions. In embodiments, some of computing logic may be implemented in hardware accelerator 805. In embodiments, part of computational logic 822, e.g., a portion of the computational logic 822 associated with the runtime environment of the compiler may be implemented in hardware accelerator 805.

The permanent copy of the executable code of the programming instructions or the bit streams for configuring hardware accelerator 805 may be placed into permanent mass storage device(s) 806 and/or hardware accelerator 805 in the factory, or in the field, through, for example, a distribution medium (not shown), such as a compact disc (CD), or through communication interface 810 (from a distribution server (not shown)). While for ease of understanding, the compiler and the hardware accelerator that executes the generated code that incorporate the predicate computation teaching of the present disclosure to increase the pipelining and/or parallel execution of nested loops are shown as being located on the same computing device, in alternate embodiments, the compiler and the hardware accelerator may be located on different computing devices.

The number, capability and/or capacity of these elements 810-812 may vary, depending on the intended use of example computer device 800, e.g., whether example computer device 800 is a smartphone, tablet, ultrabook, a laptop, a server, a set-top box, a game console, a camera, and so forth. The constitutions of these elements 810-812 are otherwise known, and accordingly will not be further described.

Finally, computing device 800 may include an optoelectronic system 850 that may include an optical device 852 with an optical receiver 854. In various embodiments, optoelectronic system 850 may be configured similarly to optoelectronic system 600 of FIG. 6, and optical device 854 may be configured similarly to optical receiver 630 of FIG. 6, and may include a metasurface lens according to various embodiments, similar (or substantially identical) to metasurface lens 621 of FIG. 6.

Illustrative examples of the technologies disclosed herein are provided below. An embodiment of the technologies may include any one or more, and any combination of, the examples described below.

EXAMPLES

Example 1 may include an optoelectronic apparatus, comprising: a substrate with a first side and a second side opposite the first side; a photodetector disposed on the first side of the substrate, the photodetector to convert a light signal into an electrical signal; and a dielectric metasurface lens etched into the second side of the substrate, the dielectric metasurface lens to collect incident light and focus it through the substrate onto the photodetector.

Example 2 may include the apparatus of example 1, and/or any other example herein, wherein the dielectric meta-surface lens is to receive the incident light from an optical fiber.

Example 3 may include the apparatus of example 2, wherein the incident light comprises a high-speed optical signal.

Example 4 may include the apparatus of example 1, and/or any other example herein, wherein a spot size of the incident light is at least twice as large as a diameter of the photodetector.

Example 5 may include the apparatus of example 4, and/or any other example herein, wherein the diameter of the photodetector is chosen to reduce a capacitance of the photodetector.

Example 6 may include the apparatus of example 4, and/or any other example herein, wherein the spot size of the incident light is from 100 to 1000 microns.

Example 7 may include the apparatus of example 6, and/or any other example herein, wherein the diameter of the photodetector is from 2 to 100 microns.

Example 8 may include the apparatus of example 1, and/or any other example herein, wherein the dielectric meta-surface lens has a first side adjacent to the second side of the substrate, and a second side, opposite the first side, the second side having a planar surface.

Example 9 may include the apparatus of example 1, and/or any other example herein, wherein the dielectric metasurface lens comprises an array of subwavelength nanostructures to achieve a phase shift of the incident light of between 0 and $2\pi$.

Example 10 may include the apparatus of example 9, and/or any other example herein, wherein the substrate comprises silicon, and the array of subwavelength nanostructures comprises high refractive index silicon features surrounded by a low refractive index material.

Example 11 may include the apparatus of example 10, and/or any other example herein, wherein the low refractive index material is one of SiO2 or air.

Example 12 may include the apparatus of example 10, and/or any other example herein, wherein the high refractive index silicon features include at least one of posts or holes.

Example 13 may include the apparatus of example 10, and/or any other example herein, wherein the array of subwavelength nanostructures includes multiple concentric belts, each belt including posts and/or holes of varying dimensions within the belt.

Example 14 may include the apparatus of example 10, and/or any other example herein, wherein the height of the subwavelength nanostructures is determined by:

$$\text{Height} \geq \lambda 0/\Delta n,$$

where $\lambda 0$ is the incident light's wavelength in air, and $\Delta n$ is the difference in refractive index between the silicon structures and the low refractive index material.

Example 15 may include the apparatus of example 10, and/or any other example herein, wherein the pitch of the subwavelength nanostructures is determined by:

$$\text{Pitch} \leq \lambda 0/n\text{high},$$

where $\lambda 0$ is the incident light's wavelength in air, and nhigh is the refractive index of the high index material.

Example 16 may include the apparatus of example 1, and/or any other example herein, wherein the dielectric metasurface lens is further to focus the incident light such that an amount of light towards a maximum is diffracted into the photodetector.

Example 17 may include the apparatus of example 1, and/or any other example herein, wherein the substrate has a high refractive index, and either low or no absorption of light at wavelengths of the incident light.

Example 18 may include an optical communications system, comprising: a light signal source to send a high speed optical signal; an optical fiber coupled to the light signal source; an optical coupler coupled to the optical fiber, to receive the high speed optical signal and couple it to an optoelectronic apparatus; and an optoelectronic apparatus, comprising: a first side on which is provided an optoelectronic device; and a second side, opposite the first side, comprising a set of high refractive index nanostructures surrounded by a low refractive index material, the optoelectronic apparatus to receive the high speed optical signal and output an electronic signal.

Example 19 may include the optical communications system of example 18, and/or any other example herein, further comprising an electrical circuit, communicatively coupled to the optoelectronic apparatus, to receive the electrical signal.

Example 20 may include the optical communications system of example 19, and/or any other example herein, wherein the high refractive index nanostructures are made of silicon, and the surrounding low refractive index material is one of air or silicon dioxide.

Example 21 may include the optical communications system of example 20, and/or any other example herein, wherein the high refractive index nanostructures comprise one or more of rectangular mesas and valleys.

Example 22 may include the optical communications system of example 20, and/or any other example herein, wherein the optoelectronic device is one of a light sensor or a camera.

Example 23 may include a method of manufacturing a circuit package, comprising:
providing a layer having a top surface and a bottom surface;
providing a light sensor on the top surface of the layer; and
processing the bottom surface of the layer to focus incident light through the layer onto the light sensor.

Example 24 may include the method of example 23, and/or any other example herein, the processing to include etching the bottom surface of the layer to form an array of subwavelength nanofeatures.

Example 25 may include the method of example 24, and/or any other example herein, wherein the array of subwavelength nanofeatures includes at least two concentric rings, each ring comprising a plurality of high refractive index post or hole structures, the post or hole structures having varying dimensions within each ring.

Example 26 may include the method of example 23, and/or any other example herein, wherein processing the bottom surface of the layer includes forming an array of subwavelength nanostructures to achieve a phase shift of the incident light of between 0 and $2\pi$.

Example 27 may include the method of example 26, and/or any other example herein, wherein the layer comprises silicon, and the array of subwavelength nanostructures comprises high refractive index silicon features surrounded by a low refractive index material.

Example 28 may include the method of example 27, and/or any other example herein, wherein the low refractive index material is one of SiO2 or air.

Example 29 may include the method of example 27, and/or any other example herein, wherein the high refractive index silicon features include at least one of posts or holes.

Example 30 may include the method of example 27, and/or any other example herein, wherein the height of the subwavelength nanostructures is determined by:

$$Height \geq \lambda 0/\Delta n,$$

where $\lambda 0$ is the incident light's wavelength in air, and $\Delta n$ is the difference in refractive index between the silicon structures and the low refractive index material.

Example 31 may include the method of example 27, and/or any other example herein, wherein the pitch of the subwavelength nanostructures is determined by:

$$Pitch \leq \lambda 0/n_{high},$$

where $\lambda 0$ is the incident light's wavelength in air, and $n_{high}$ is the refractive index of the high index material.

Example 32 may include the method of example 23, and/or any other example herein, wherein the bottom surface of the layer is processed to focus the incident light such that an amount of light towards a maximum is diffracted onto the light sensor.

Example 33 may include a manufacturing device, comprising: means to provide a layer having a top surface and a bottom surface; means to provide a light sensor on the top surface of the layer; and means to process the bottom surface of the layer to focus incident light through the layer onto the light sensor.

Example 34 may include the manufacturing device of example 33, and/or any other example herein, the means to process including means to etch the bottom surface of the layer to form an array of subwavelength nanofeatures.

Example 35 may include the manufacturing device of example 34, and/or any other example herein, wherein the array of subwavelength nanofeatures includes at least two concentric rings, each ring comprising a plurality of high refractive index post or hole structures, the post or hole structures having varying dimensions within each ring.

What is claimed is:

1. An optoelectronic apparatus, comprising:
   a substrate with a first side and a second side opposite the first side;
   a photodetector disposed on the first side of the substrate, to convert a light signal into an electrical signal; and
   a dielectric metasurface lens etched into the second side of the substrate, the dielectric metasurface lens to collect incident light and focus it through the substrate onto the photodetector, wherein a surface of the dielectric metasurface lens comprises a plurality of repeated concentric belts, to provide for a change in phase at different radial distances along the dielectric metasurface lens in each of the repeated concentric belts, wherein a width of one of the plurality of repeated concentric belts is defined by a function of a thickness of the substrate, wherein the width of the one of the plurality of repeated concentric belts decreases for each repeated concentric belt of the plurality of repeated concentric belts corresponding to a distance between a center of the dielectric metasurface lens and the one of the plurality of repeated concentric belts, wherein the one of the plurality of repeated concentric belts comprises:
   a first structure that includes a first silicon (Si);
   a second structure adjacent to the first structure, wherein the second structure includes a second Si with multiple holes cut into the second Si;
   a third structure adjacent to the second structure, wherein the third structure includes a third Si with multiple holes comprising a first silicon oxide (SiO2) cut into the third Si;
   a fourth structure adjacent to the third structure, wherein the fourth structure includes a shape that is inverse relative to the third structure, and further includes a second SiO2 with multiple holes comprising a fourth Si cut into the second SiO2;
   a fifth structure adjacent to the fourth structure, wherein the fifth structure includes a shape that is inverse to the second structure and further includes a third SiO2 with multiple holes cut into the third SiO2; and
   a sixth structure adjacent to the fifth structure, wherein the sixth structure includes a fourth SiO2.

2. The apparatus of claim 1, wherein the dielectric metasurface lens is to receive the incident light.

3. The apparatus of claim 2, wherein the incident light comprises a high-speed optical signal.

4. The apparatus of claim 1, wherein a spot size of the incident light is at least twice as large as a diameter of the photodetector.

5. The apparatus of claim 4, wherein the diameter of the photodetector is chosen to reduce a capacitance of the photodetector.

6. The apparatus of claim 4, wherein the spot size of the incident light is from 100 to 1000 microns.

7. The apparatus of claim 6, wherein the diameter of the photodetector is from 2 to 100 microns.

8. The apparatus of claim 1, wherein the dielectric metasurface lens has a first side adjacent to the second side of the substrate, and a second side, opposite the first side, the second side having a planar surface.

9. The apparatus of claim 1, wherein the dielectric metasurface lens comprises an array of subwavelength nanostructures to achieve a phase shift of the incident light of between 0 and $2\pi$.

10. The apparatus of claim 9, wherein the substrate comprises silicon, and the array of subwavelength nanostructures comprises high refractive index silicon features surrounded by a low refractive index material.

11. The apparatus of claim 10, wherein the low refractive index material is one of SiO2 or air.

12. The apparatus of claim 10, wherein the high refractive index silicon features include at least one of posts or holes.

13. The apparatus of claim 10, wherein a height of the subwavelength nanostructures is determined by:

$$\text{height} \geq \lambda 0/\Delta n,$$

where $\lambda 0$ is the incident light's wavelength in air, and $\Delta n$ is the difference in refractive index between the silicon structures and the low refractive index material.

14. The apparatus of claim 10, wherein a pitch of the subwavelength nanostructures is determined by:

$$\text{pitch} \leq \lambda 0/n\text{high},$$

where $\lambda 0$ is the incident light's wavelength in air, and nhigh is the refractive index of a high index material.

15. The apparatus of claim 1, wherein the dielectric metasurface lens is further to focus the incident light such that an amount of light towards a maximum is diffracted into the photodetector.

16. The apparatus of claim 1, wherein the substrate has a high refractive index, and either low or no absorption of light at wavelengths of the incident light.

17. An optical communications system, comprising:
a light signal source to send a high-speed optical signal;
an optical fiber coupled to the light signal source;
an optical coupler coupled to the optical fiber, to receive the high-speed optical signal and couple it to an optoelectronic apparatus, wherein the optoelectronic apparatus is to receive the high-speed optical signal and output an electrical signal, wherein the optoelectronic apparatus includes:
a substrate with a first side and a second side opposite the first side;
a photodetector disposed on the first side of the substrate, to convert the high-speed optical signal into the electrical signal; and
a dielectric metasurface lens etched into the second side of the substrate, the dielectric metasurface lens to collect incident light and focus it through the substrate onto the photodetector, wherein a surface of the dielectric metasurface lens comprises a plurality of repeated concentric belts, to provide for a change in phase at different radial distances along the dielectric metasurface lens in each of the repeated concentric belts, wherein a width of one of the plurality of repeated concentric belts is defined by a function of a thickness of the substrate, wherein the width of the one of the plurality of repeated concentric belts decreases for each repeated concentric belt of the plurality of repeated concentric belts corresponding to a distance between a center of the dielectric metasurface lens and the one of the plurality of repeated concentric belts, wherein the one of the plurality of repeated concentric belts comprises:
a first structure that includes a first silicon (Si);
a second structure adjacent to the first structure, wherein the second structure includes a second Si with multiple holes cut into the second Si;
a third structure adjacent to the second structure, wherein the third structure includes a third Si with multiple holes comprising first silicon oxide (SiO2) cut into the third Si;
a fourth structure adjacent to the third structure, wherein the fourth structure includes a shape that is inverse relative to the third structure, and further includes a second SiO2 with multiple holes comprising a fourth Si cut into the second SiO2;
a fifth structure adjacent to the fourth structure, wherein the fifth structure includes a shape that is inverse to the second structure and further includes a third SiO2 with multiple holes cut into the third SiO2; and
a sixth structure adjacent to the fifth structure, wherein the sixth structure includes a fourth SiO2.

18. The optical communications system of claim 17, further comprising an electrical circuit, communicatively coupled to the optoelectronic apparatus, to receive the electrical signal.

19. The optical communications system of claim 18, wherein high refractive index nanostructures are made of silicon, and a surrounding low refractive index material is one of air or silicon dioxide.

20. The optical communications system of claim 19, wherein the high refractive index nanostructures comprise one or more of rectangular mesas and valleys.

21. The optical communications system of claim 19, wherein the optoelectronic apparatus is one of a light sensor or a camera.

22. A method, comprising:
providing a substrate having a first side and a second side opposite the first side; and
etching a dielectric metasurface lens into the second side of the substrate, including providing, on a surface of the dielectric metasurface lens, a plurality of repeated concentric belts, to provide for a change in phase at different radial distances along the dielectric metasurface lens in each of the repeated concentric belts, wherein a width of one of the plurality of repeated concentric belts is defined by a function of a thickness of the substrate, wherein the width of the one of the plurality of repeated concentric belts decreases for each repeated concentric belt of the plurality of repeated concentric belts corresponding to a distance between a center of the dielectric metasurface lens and the one of the plurality of repeated concentric belts, wherein the providing of the plurality of repeated concentric belts includes, for the one of the plurality of repeated concentric belts:
forming a first structure that includes a first silicon (Si);
forming a second structure adjacent to the first structure, wherein the second structure includes a second Si with multiple holes cut into the second Si;
forming a third structure adjacent to the second structure, wherein the third structure includes a third Si with multiple holes comprising first silicon oxide (SiO2) cut into the third Si;
forming a fourth structure adjacent to the third structure, wherein the fourth structure includes a shape that is inverse relative to the third structure, and further includes a second SiO2 with multiple holes comprising a fourth Si cut into the second SiO2;
forming a fifth structure adjacent to the fourth structure, wherein the fifth structure includes a shape that is inverse to the second structure and further includes a third SiO2 with multiple holes cut into the third SiO2; and forming a sixth structure adjacent to the fifth structure, wherein the sixth structure includes a fourth SiO2.

23. The method of claim 22, further comprising:
disposing a photodetector on the first side of the substrate, wherein the dielectric metasurface lens is to collect incident light and focus it through the substrate onto the photodetector.

\* \* \* \* \*